United States Patent [19]
Roy

[11] Patent Number: 5,153,701
[45] Date of Patent: Oct. 6, 1992

[54] SEMICONDUCTOR DEVICE WITH LOW DEFECT DENSITY OXIDE

[75] Inventor: Pradip K. Roy, Allentown, Pa.

[73] Assignee: AT&T Bell Laboratories, Murray Hill, N.J.

[21] Appl. No.: 529,771

[22] Filed: May 25, 1990

Related U.S. Application Data

[60] Continuation-in-part of Ser. No. 333,359, Apr. 4, 1989, abandoned, which is a division of Ser. No. 138,633, Dec. 28, 1987, Pat. No. 4,851,370.

[51] Int. Cl.$^5$ ............... H01L 29/78; H01L 29/34; H01L 29/04
[52] U.S. Cl. ................... 357/54; 357/23.15; 357/59
[58] Field of Search .............. 357/4, 23.15, 54, 59; 365/203; 437/238

[56] References Cited

U.S. PATENT DOCUMENTS

| | | | |
|---|---|---|---|
| 4,140,548 | 2/1979 | Zimmer | 357/23.15 |
| 4,214,919 | 7/1980 | Young | 357/54 |
| 4,305,200 | 12/1981 | Fu et al. | 357/41 |
| 4,518,630 | 8/1985 | Grasser | 437/238 |
| 4,794,571 | 12/1988 | Uchidee | 365/203 |

OTHER PUBLICATIONS

B. E. Deal, "Historical Perspectives of Silicon Oxidation", *The Physics and Chemistry of SiO$_2$ and the Si-SiO$_2$ Interface*, edited by C. Helms et al. (1988) pp. 5-15.
R. Dorn et al., "The Adsorption of Oxygen on Silicon (III) Surfaces, II", *Surface Science*, 42 (1974) pp. 583 to 594.
D. R. Ulrich "Sol-Gel Processing", *Chem. Tech.* (Apr. 1988) pp. 242-249.
S. M. Sze, *Semiconductor Devices Physics and Technology*, John Wiley & Sons (1985) p. 350.
"Controlled Nitridation of SiO$_2$ for the Formation of Gate Insulators in FET Devices", *IBM Technical Disclosure Bulletin*, vol. 28, No. 6 (Nov. 1985) pp. 2665-2666.
S. M. Sze, *Semiconductor Divices, Physics and Technology*, John Wiley & Sons (1985) p. 345.

*Primary Examiner*—J. Carroll
*Attorney, Agent, or Firm*—Wendy W. Koba

[57] ABSTRACT

Low defect density oxides suitable for use as thin gate oxides or in charge storage capacitors are described. First and second layers are formed on a substrate with misaligned defect structures. A third layer is then grown by diffusing a species through the first and second layers to the substrate. The species reacts with the substrate. The low defect density results from the misaligned defect structure of the first and second layers. In one embodiment, the first and second layers are grown and deposited oxides, respectively. The third layer is grown by diffusing oxygen through the first two layers and the interface between the first and second layers acts as a sink trapping defects. The oxide silicon interface has desirable characteristics because the oxide grows in near equilibrium conditions.

6 Claims, 4 Drawing Sheets

SEMICONDUCTOR DEVICE WITH LOW DEFECT DENSITY OXIDE

This application is a continuation of U.S. application Ser. No. 07/333,359 filed Apr. 4, 1990, abandoned, which is a division of U.S. application Ser. No. 07/138,633 filed Dec. 28, 1987, U.S. Pat. No. 4,851,370.

TECHNICAL FIELD

This invention relates to a method of making semiconductor integrated circuits having a thin oxide region and to integrated circuits made by this method.

BACKGROUND OF THE INVENTION

As integrated circuit complexity increases, the dimensions of the devices within the circuit necessarily decrease. In fact, integrated circuit technology is rapidly approaching submicron feature size. Although one generally first thinks of reducing the source, gate and drain dimensions of field effect transistors, another device element whose dimension must also be shrunk is the dielectric layer commonly used, e.g., for a gate dielectric. Thicknesses less than several tens of nms are now desirable for many of these device elements. However, as the gate dielectric becomes thinner, the importance of dielectric quality, including both low defect density ($D_o$) and dielectric processing sensitivity, becomes greater with respect to device performance. Low defect density and processing sensitivity are, of course, also important in other integrated circuit applications.

In fact, in VLSI circuits, the quality of dielectric layers ultimately becomes a dominant factor in determining device performance. Consider field effect transistors (FETs) which use a voltage applied to a gate electrode to control current flow in a channel between source and drain regions. The electrode includes a capacitor and a typical dielectric is silicon oxide. If the source and drain regions have n-type conductivity, a positive gate voltage, $V_g$, induces negative charges in the channel. Current flows in the channel when the gate voltage exceeds the threshold voltage.

In an ideal FET, the gate voltage may be arbitrarily large with no current flow through and charge storage in the dielectric. In practice, however, it is impossible to eliminate trapped charges in the dielectric which cause operating instabilities due to charge induced shifts in the threshold voltage. This shift may be better understood from the following considerations. The voltage shift due to the trapped charges is proportional to $Q_t/C$, where $Q_t$ is the trapped charge and C is the capacitance. Although the voltage shift decreases as the oxide thickness decreases, the compensation for trapped charges need not be reduced in the scalling to smaller dimensions. In fact, charge trapping, and defect induced dielectric breakdown set the scaling limits for thin oxides. It is thus essential that the number of defects in the dielectric be minimized for best device performance. However, Yamabe et al, Proceedings of the 21st Reliability Physics Symposium, pp. 184-190, Phoenix, Ariz., 1983, reported that the defect density, in particular, pinholes, increased with decreasing silicon oxide thickness once the oxide was less than 20 nm thick.

The silicon oxide, $SiO_2$, is the most commonly used dielectric material, at least for Si integrated circuits, and may be formed either by thermal growth or material deposition. Thermal oxidation of silicon involves a reaction of the oxide/silicon interface that is driven by inward movement of the oxidizing species. Thus, the silicon surface is continually renewed and the bulk $SiO_2$ is maintained with sufficient oxygen to remove the majority of the bulk and surface defects. Surface passivation reduces the number of states within the bandgap by lowering the number of dangling bonds because a stable $SiO_2$ film is formed.

Although deposited films can be grown more quickly than can thermal oxides, the dielectric qualities of deposited films are generally inferior to those of thermally grown oxide films. Thus, deposited oxides have not been used as dielectrics because they typically have a high $D_o$, greater than 5 cm$^{-2}$; low breakdown fields, $F_{bd}$ approximately 3 MV/cm; and high interface state densities, $Q_{it}$ greater than $10^{12}$ cm$^{-2}$eV$^{-1}$. However, a low temperature plasma enhanced chemical vapor deposition process was reported as yielding a moderately high quality $SiO_2$ layer. See, Journal of Applied Physics, 60, pp. 3136-3145, Nov. 1, 1986. The interface trap density was reduced by a fast deposition anneal. Other deposition processes generally have an annealing step to both densify the oxide and improve its electrical integrity, but the results have not been as good as is desired if the oxide will be used as a gate dielectric.

Attempts have been made to avoid some of the problems resulting from the high defect density in deposited oxides by fabricating a dual dielectric such as that formed by $Si_3N_4/SiO_2$. For example, Watanabe et al., IEEE International Reliability Physics Symposium, pp. 18-23, 1985, fabricated a $SiO_2/Si_3N_4/SiO_2$ structure with an oxide thickness between 10 nm and 20 nm and a $D_o$ of 0.5 cm$^{-2}$ together with a $F_{bd}$ greater than 9 MV/cm. The bottom oxide layer was thermally grown and the $Si_3N_4$ layer was then deposited and partially oxidized. While the dual dielectric structure has a low leakage current and a high breakdown voltage, the $Si_3N_4/SiO_2$ interface has a high density of states that act as traps. These states cannot be removed by annealing because the nitride is impervious to the oxidizing species. Moreover, the interface states can be populated or depopulated by varying the electrode bias. They thus cause instabilities in device operation because of charge induced shifts in the threshold voltage and a reduction in the channel conductance. Therefore, this dual dielectric is not ideally suited for use as a gate dielectric as well as for other uses.

SUMMARY OF THE INVENTION

A method of fabricating a multilayer structure on a substrate comprising the steps of forming first and second layers having first and second compositions on a substrate, the first and second layers having an interface and first and second defect structures with the defects in the first and second layers being misaligned with respect to each other, and growing a third layer underneath the first layer by diffusing a species through said first and second layers to said substrate where said species reacts with said substrate. The interface between the first and second layers acts as a sink and traps defects. Thus, the defect densities in the first and second layers are reduced during growth of the third layer. In one embodiment, the second layer is densified during growth of the third layer in the presence of a stress accommodating interface between the first and second layers.

The third layer forms an interface between the substrate and the multilayered dielectric structure. The growth of the third layer occurs in near-equilibrium condition and the layer has excellent structural properties thus giving rise to a stress-free and planar substrate/dielectric interface with desirable interfacial and electrical properties. In a preferred embodiment, the first and second compositions are oxides and the substrate is silicon. The species is oxygen which forms silicon dioxide when it reacts with the substrate.

In a particular preferred embodiment, a thin oxide is obtained by a method comprising growing a thermal oxide, depositing an oxide layer by chemical vapor deposition, and annealing in an oxidizing environment to both densify the deposited and grow additional oxide. The substrate is silicon. The thermal and deposited oxides form the first and second layers, respectively. The additional oxide is the third layer and is formed by the movement of oxygen through the first and second layers to the substrate where it reacts to form an oxide. The oxide can have a low defect density, typically less than 0.5 cm$^{-2}$, and a high breakdown voltage, greater than 10 MV cm$^{-1}$. In fact, defect densities less than 0.10 cm$^{-2}$ have been obtained.

The first step uses a conventional dry oxidation to grow a SiO$_2$ layer on the Si substrate at a temperature between 850° C. and 1100° C. A CVD process, which may be low pressure or plasma enhanced, deposits a porous oxide layer with an interface between the deposited and grown oxides. The interface is important for both stress accommodation and relaxation. During the annealing step, newly grown SiO$_2$ forms through the diffusional transport of a species, oxygen, through the porous structures of the deposited and grown layer to the Si/SiO$_2$ interface. The deposited layer is, however, a barrier to alkali metal ion transport due to the small size of the defects. The oxides are, however, transparent to oxygen, and therefore, charge traps are annealed out during densification and oxidizing anneal. Moreover, the third SiO$_2$ layer grows under the near equilibrium conditions provided by the stress accommodating structure thus generating an Si/SiO$_2$ interface with minimum roughness and stress gradient. The thin oxide is useful as, for example, a gate oxide, in a charge storage capacitor or as a floating gate tunneling oxide.

DETAILED DESCRIPTION

An exemplary embodiment will be briefly discussed by reference to FIG. 1. A detailed example will be presented and discussed. After this discussion, variations and other embodiments will be mentioned and still others will be readily apparent to those skilled in the art.

Figure 1:
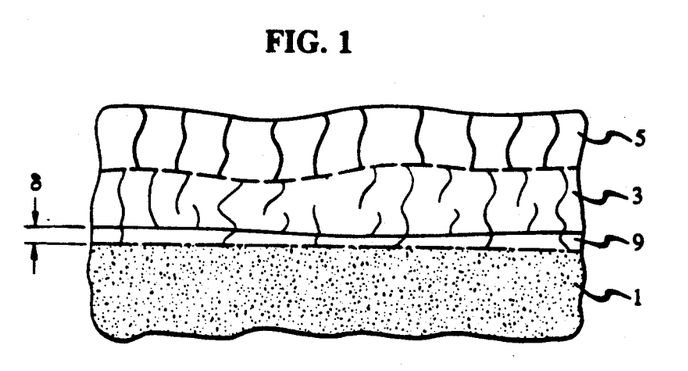
FIG. 1 is a schematic representation of a structure according to this invention.

Referring now to FIG. 1, a silicon substrate 1 is used. A thin, approximately 5 nm thick, layer, i.e., the first layer 3, of thermal oxide is grown using conventional techniques. An oxide layer, i.e., the second layer 5, approximately 5 nm thick is deposited by the low pressure chemical vapor deposition decomposition of tetraethoxysilane (TEOS). The interface between the two oxide layers is shown by the horizontal dashed line.

The deposition temperature for the second layer 5 is in the range from approximately 625° to approximately 750° C. The pressure is between 150 and 400 mtorrs. An exemplary temperature is approximately 635° C. and an exemplary pressure is 260 mtorr.

As can be seen, each layer has a plurality of defects, i.e., first and second defect structures, which are schematically represented by the substantially vertical wavy lines. The defects are misaligned with respect to each other, i.e., the defects within each layer terminate at the interface of layers 3 and 5. Defects may be any type of deviation from crystal perfection such as, e.g., dislocations, pores, etc. Defects are less than approximately 10 nm in diameter with an average inter-defect spacing of about 10 nm. A typical diameter is approximately 1 nm.

An annealing step, which both densifies the existing oxides and grows a new oxide, is now performed. This anneal begins at a temperature of approximately 750° C., and the temperature is increased to approximately 900° C. at a rate of 5° C. per minute. The temperature of 900° is held for approximately nine minutes followed by a decrease at the rate of approximately 3.3° per minute. The atmospheres are a mixture of oxygen and nitrogen with the oxygen content being greatest at the highest temperature. The new oxide layer 9 has a thickness, δ, which is the amount that the SiO$_2$/Si interface moves during the anneal. The interface between layers 3 and 9 is shown by a horizontal line. Layers 3 and 5 must permit the diffusional transport of the oxidizing species, namely, oxygen.

The structure described has a low defect density as well as low oxide charge ($Q_f$) and interface trap densities ($Q_{it}$). Degradation in device performance, characterized by instabilities in threshold voltage and increases in surface generation and recombination rates, is believed to be directly related to D$_o$ and trapped charge ($Q_f$ and $Q_{it}$).

The low value obtained for D$_o$ is better understood from the following considerations. For thin oxide gate dielectrics, the major contributors to D$_o$ are the growth induced defect density and the intrinsic stress within the oxide layer. Defects form at energetically favored sites such as heterogeneities formed by localized contaminants, ion damaged areas and faulting on silicon nucleation surfaces because of retarded oxidation. The defects grow outward as oxidation consumes silicon around the defect and eventually a network of defects exists. The defects may be viewed as pipes for diffusional mass transport as well as potential current paths which would have substantial impact on device performance and reliability.

To obtain a low D$_o$, not only must the defect density be reduced but the local stress gradient must be reduced by providing a stress accommodating interface within the dielectric film.

Stress incorporation in SiO$_2$ films is due to incomplete relaxation of the viscoelastic compressive stress at oxidation temperatures less than 900 degrees C and the thermal expansion mismatch between SiO$_2$ and Si. Moreover, complex device geometry and processing frequently results in locally high stress levels which induce the generation and propagation of defects thereby increasing both the size and density of defects. The interface may be between two different dielectrics, such as two types of oxides, e.g., the thermal and deposited oxides described with respect to FIG. 1. The interface effectively reduces the defect density by providing a discontinuity in the defect structure. The interface is not effective in reducing the effective defect density if the defects in the two dielectrics are aligned, i.e., if they are not misaligned and there is no discontinuity.

In a preferred embodiment, the interface is formed between the thermally grown and the deposited $SiO_2$ regions. The interface both accommodates and relaxes the stress and also acts as a defect sink within two oxide layers.

Not all combinations of dielectric materials are useful in this invention. For example, although the $SiO_2$/$Si_3N_4$ structure has a low defect density, it also has a high density of traps that cannot be reduced by annealing. This structure is therefore not useful in this invention unless the nitride layer is completely consumed to form silicon oxynitride. However, the thermally grown/deposited oxide structure has a low defect density as well as a low density of interface traps which can be removed by annealing. This difference in behavior between these two dual dielectrics is better understood from the following considerations.

During annealing, oxide growth occurs as the oxidizing species diffuses through the existing oxide and then reacts with silicon at the $Si/SiO_2$ interface. The oxidation reaction results in interfacial movement into the silicon substrate. It has been found experimentally by a transmission electron microscopy lattice imaging technique that this movement reduces the interfacial roughness and the number of asperities.

The presence of defects within the oxides enhances the transport of the oxidant by diffusion. That is, the defects provide paths for the oxidant. The newly grown $SiO_2$ is structurally superior to the thermally grown and deposited oxides because the growth occurs under the stress accommodating conditions provided by the interface which acts as a stress cushion. The interface also acts as a defect sink and as a barrier for the diffusional transport of alkali metal ions from the ambient environment to the $Si/SiO_2$ interface. The oxidation reaction during the densification anneal produces a reduction in the number of interface traps together with a simultaneous reduction in the interface stress gradient, roughness and number of asperities. In the example described, the densification resulted in a total oxide thickness of approximately 15 nm. Thinner films may be obtained by reducing the oxygen partial pressure in the oxidant gas phase.

In contrast, the $Si_3N_4/SiO_2$ structure is opaque to the diffusion of the oxidant. During the oxidizing anneal, the top of the $Si_3N_4$ oxidizes to form silicon oxynitride without any oxidant transport to the interface. Thus, the density of interface states remains unchanged after an oxidizing anneal in this dual dielectric film. Moreover, because the $Si_3N_4$ layer is relatively impervious to the diffusional transport of the oxidizing species, there is very little reduction in the interfacial roughness and number of asperities as there is no interfacial oxidation reaction during the densification anneal.

Variations are contemplated. The top oxide layer may be formed in different ways. For example, a polysilicon layer may be deposited and oxidized or a thin nitride layer may be completely oxidized. Other variations will be readily thought of by those skilled in the art.

DETAILED EXAMPLES

The structure depicted in FIG. 1 was fabricated on a plurality of Si substrates and examined in several ways for quality. The substrates were p/p+ <100> oriented 125 mm in diameter and 625 $\mu$m thick with a resistivity between 0.006 and 0.010 ohm-cm. The 16.5 $\mu$m thick p-type epitaxial layer had a boron concentration between 2 and $5 \times 10^{+14}$ cm$^{-3}$ (15-20 ohm-cm).

The test structure used to evaluate the thin gate oxide quality in terms of $F_{bd}$ and $D_o$ was similar to the twin-tub CMOS technology described by L. C. Parrillo et al. in IEDM Technical Digest, pp. 752-755, 1980. The thin gate oxide regions were defined by 700 nm thick layer of field oxide (FOX) and a 100 nm thick layer of a sacrificial gate oxide grown pyrogenically at 950° C. The latter was stripped chemically immediately prior to the gate oxidation described later. Following the gate oxidation, a 420 nm thick LPCVD polysilicon layer was deposited followed by a 950° C. vapor phase doping of the polysilicon layer by $PBr_3$ to obtain a sheet resistance which is typically 20 ohms/square. The doped polysilicon layer was patterned using a reticle covering the gate thin oxide regions and overlapping, by several microns, onto FOX.

For C-V measurements, unpatterned substrates were used, and thin oxide films were grown on the entire substrates after standard preoxidation cleaning. Following oxidation, a 420 nm thick LPCVD polysilicon layer was deposited and doped with phosphorus. Shadow masked patterned aluminum dots 1 to 2 $\mu$m in diameter were deposited on the front side and sintered at 375° C. for 30 minutes. The polysilicon layer was then selectively etched using aluminum as an etch mask. After stripping the back side doped glass, a 100 nm thick aluminum layer was deposited on the back to form a substrate contact.

The $Si/SiO_2$ interfacial quality and structural characteristics of the thin oxide films were ascertained by x-ray microdiffraction (XRMD) Si(400) peak profiling and transmission electron microscopic (TEM) Si(111) lattice imaging of the interface. The wave length dependence of the Fourier Transform Infrared (FTIR) absorbance spectra of the Si—O vibrational modes was also measured in conjunction with XRMD technique.

Stacked layered gate oxide films with 10, 15 and 25 nm thicknesses were compared, in terms of structural and electrical properties, with thin gate oxide films of equivalent thicknesses which were grown by conventional thermal oxidation.

The device processing capabilities of these oxides were demonstrated through successful fabrication of both megabit DRAM (1.25 $\mu$m technology) and 64K SRAM (0.9 $\mu$m technology) circuits.

A conventional oxidation procedure, including standard preoxidation cleaning to remove organic and inorganic contaminants by sequential cleaning, rinsing, and drying in the following solutions: a) 5:1 $H_2SO_4/H_2O_2$ (90° C.); b) $NH_4OH/H_2O_2$ (85° C.); and c) 15:1 $HF/H_2O$ (25° C.). The preoxidation cleaning procedure is well known to those skilled in the art. The oxidation was done in a three-zone resistance heated furnace that utilizes a quartz or SiC tube and a paddle which holds the wafer containing quartz boats. Three thermocouples outside the furnace liner were used for temperature control. A second group of thermocouples (between the liner and the furnace tube) was used for temperature profiling and wafer temperature calibration. Microprocessor temperature control was done automatically. The microprocessor also automatically controlled the sequence and gas flow rates for predetermined time intervals at specific temperatures. The flat zone was maintained within ±1° C. over 75 cm during full ramp span.

The generalized thermal schedule and gas flow sequence for the first $SiO_2$ growth will be described by reference to FIG. 2. Time is plotted horizontally and temperature vertically. Both scales are in arbitrary units. The oxidation cycle starts at time $t_1$, with the insertion of boat under inert (100 percent Ar) or slightly oxidizing ($O_2$:HCl with large mole fraction of Ar) ambient at temperature $T_i$(750° C.) for 10 minutes to time $t_2$ followed by a ramp up (5° C./min) to the flat zone temperature $T_F$ of 950° C. at time $t_3$. At this time, the mole fraction of oxidant ($O_2$:HCl) was increased with respect to the carrier gas, Ar, to attain an average growth rate of 1.0–1.5 nm/minute.

The isothermal holding time, $t_3$ to $t_4$, at the growth temperature, $T_F$ (950° C.), was varied to obtain thermally grown $SiO_2$ layer thicknesses of 3.5, 5.0, 10.0, 15.0 and 25.0 nm. After the completion of the $SiO_2$ growth at time $t_4$, the structures were given a post-oxidation anneal in 100 percent Ar for a time period $t_4$ to $t_5$ of 45 minutes followed by a ramp down at the rate of 3.5° C./min to a temperature of 750° C. at time $t_6$. At this temperature, the boat traveled under isothermal condition until $t_7$, when it was cooled under an inert ambient and then taken to an LPCVD furnace for the deposition of the second $SiO_2$ layer. The post-oxidation anneal is necessary on thin $SiO_2$ gate oxides to improve the breakdown field distribution and to control the fixed charge ($Q_f$) within the oxide. See, for example, M. Arienzo et al. in Applied Physics Letters, 49, p. 1040–1042, Oct. 20, 1986.

The LPCVD $SiO_2$ deposition onto the grown $SiO_2$ layer was done at a pressure 0.26 torr by the pyrolysis of TEOS at 635° C. The deposition equipment is similar to the LPCVD system described in detail by A. C. Adams and C. D. Capio in the Journal of Electrochemical Society, 126, pp. 1042–1046, June 1979. In a typical deposition sequence, wafers with thermally grown $SiO_2$ were loaded and the reaction tube was evacuated to 0.02 torr. Immediately following loading, a temperature drop of 70° C. was typically observed and 40–45 minutes of soaking time were typically required for substrates to reach thermal equilibrium. After the first 10 minutes of soaking at 0.02 torr, the system was purged with $O_2$ at a small flow rate (0.5 liters/min) for 32 minutes while the temperature was allowed to stabilize. The system was then subjected to an additional soaking for 4 minutes under 0.02 torr. Immediately following soaking, TEOS vapor was introduced. The flow rate was controlled by the liquid TEOS source temperature, typically 35° C. A temperature controller maintained optimum conditions and a deposition rate of 1.4 nm/minute. LPCVD pressure was maintained at 0.260 torr during $SiO_2$ deposition by a pressure control system which used the butterfly valves of the capacitance manometer. The pyrolytic decomposition temperature, 635° C., was maintained by a furnace temperature controller. The inter-wafer spacing, which is another variable that can affect the film uniformity and the $SiO_2$ deposition rate, was 0.95 cm. A deposition time of 3.6 minutes was required for a 5 nm thick deposited oxide.

Further lowering of the deposition rate without sacrificing uniformity can easily be attained by reducing the deposition temperature and/or the liquid TEOS source temperature. At the end of the deposition, the butterfly valves were closed and the reactor was evacuated to 0.02 torr for 3 minutes. The system was then purged with $O_2$ at 0.5 liters/minute for 8 minutes to remove undecomposed TEOS from the tube. The tube was then backfilled with $N_2$ and the wafers were withdrawn.

The final step was the densification anneal under mild oxidizing conditions. During this process step, $SiO_2$ layer 9 grew in near-equilibrium conditions thus reducing traps, stress-gradient and asperities in the Si/$SiO_2$ interface. The densification anneal was carried out in the same three-zone resistance heated oxidation furnace described above.

Figure 2:
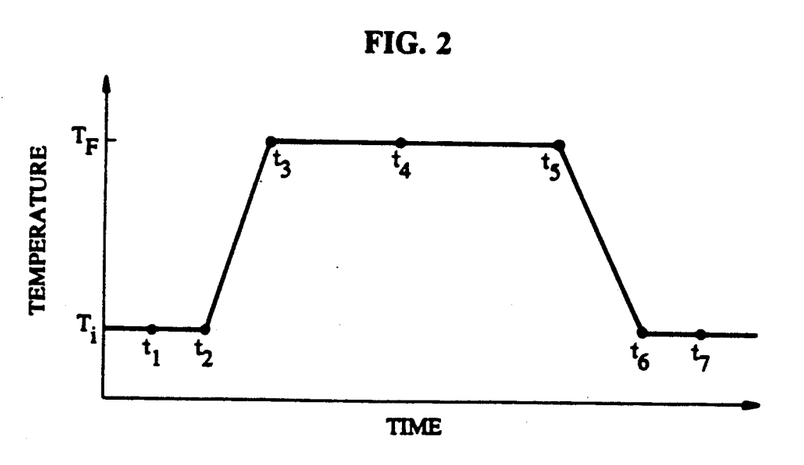
FIG. 2 shows the general thermal history for an oxidation step.

The microprocessor-controlled thermal scheduling schematic is also shown in FIG. 2. The densification cycle starts at $T_i$, 750° C., with a boat travel-in time of $t_1t_2$, 10 minutes, followed by a ramp-up at the rate of 5° C./min. to the flat-zone oxidation temperature, $T_F$, of 900° C. for time $t_2t_3$ of 30 minutes. The gas flow condition during this period was maintained constant with a $N_2$ and $O_2$ flow rates of 18 and 2 liters per min., respectively. For growing a 5 nm thick $SiO_2$ layer during densification on a 10 nm stacked oxide coated Si substrate, an annealing time of 9 minutes with 54 percent $O_2$ in the oxidant ($O_2$:$N_2$) gas phase was used. For thinner oxides, i.e., less than 10 nm, due to the total thickness restriction, a $SiO_2$ layer 2 to 3 nm thick was grown on a 7.5 nm stacked oxide coated silicon substrate. This growth was achieved by reducing the volume fraction of $O_2$ to 10% in the oxidant and/or the oxidation time $t_3t_4$. It is always desirable to grow at least 2.5 nm of $SiO_2$ during the densification anneal since the last oxide constitutes an integral part of the Si/$SiO_2$ interface. Furthermore, optimum reduction in the interfacial roughness and stress gradient is not possible for $\delta < 2.5$ nm. Immediately following densification, the substrate temperatures were ramped down at a rate of 3.3°/min. to 750° C. at time $t_6$, and the boat traveled out of the furnace at a predetermined rate during the time $t_6t_7$ followed by furnace cooling under $N_2$ purge.

STRUCTURAL AND ELECTRICAL CHARACTERIZATIONS i) Oxide Thickness

Figure 3:
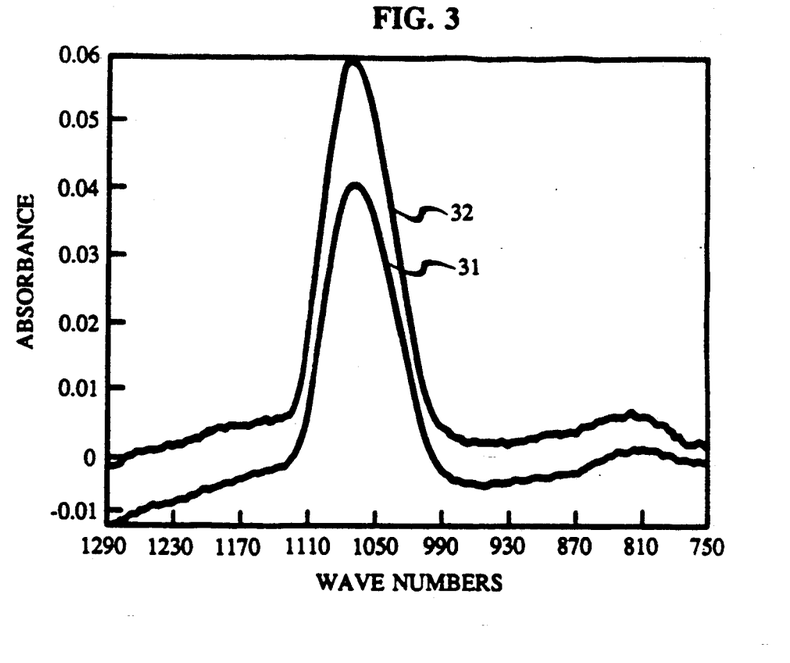
FIG. 3 shows a typical FTIR absorbance (Si—O) spectra for the oxide before and after annealing.

Oxide thickness measurements were done by ellipsometry at a wavelength of 546.1 nm. Fourier transform infrared (FTIR) absorbance Si—O spectra of the 1100 $cm^{-1}$ band was used to ascertain the quality of the oxide in terms of pore density and the Si—O band strain. FIG. 3 shows typical FTIR absorbance (Si—O) spectra for the multilayered stacked oxide before and after densification. The wave numbers are plotted horizontally and the absorbance vertically. Curves 31 and 32 are before and after densification, respectively. The difference in the spectra is a direct measure of the $SiO_2$ growth during densification. The integral peak width is less than or equal to the peak width of the best thermal oxide in terms of $D_o$ when layers of similar thickness are compared.

ii) Stress Measurements

The stress in the silicon layer near the Si/$SiO_2$ interface, which reflects the stress within the oxide layer, was measured by Si(400), 2Θ Bragg peak profiling using the x-ray microdiffractometer (XRMD) technique described in U.S. Pat. No. 4,631,804 issued Dec. 30, 1986 to P. K. Roy. The diffracted signal at any localized area within the SiO$_2$/Si is a volume average of the irradiated volume generated from a 30 μm diameter collimated Cu Kα x-ray within a penetration depth of 8 μm. To enhance signal collection, the microdiffractometer employs a slit and detector system to collect the entire diffracted Debye-ring rather than a small fraction of it as in a conventional XRD. This technique is very useful in detecting small and subtle changes in peak profiles. The Si(400),2Θ peak position is a direct measure of the interplanar spacing (d) of the (400) planes. Any deviation from the unstressed value of 2Θ° is a measure of lattice dilation Δd (d-d$_o$) which is related to the stress in silicon ($\sigma_{si}$) from the diffracted volume of SiO$_2$/Si using the elastic stiffness values of silicon. H. Iechi and S. Sutoh in the Japanese Journal of Applied Physics, V-23, pp L743–L745, September, 1984, described the above conversion to $\sigma_{si}$ from the observed changes in lattice spacings. Furthermore, the peak breadth gives information about the silicon substructure in terms of crystallite size and defect state.

Figure 4:
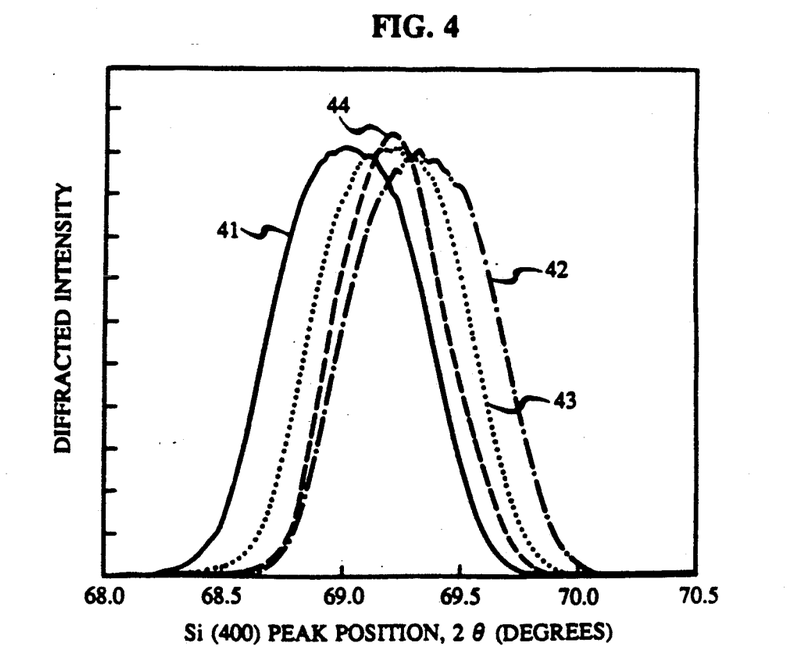
FIG. 4 plots the Si (400), 2θ, peak position as obtained by x-ray microdiffraction.

FIG. 4 shows the Si(400),2Θ peak position of the multilayered stacked SiO$_2$ film at various stages of synthesis. The peak position is plotted horizontally and the intensity vertically in arbitrary units. Curves 41, 42, 43 and 44, are for the thermal SiO$_2$ layer, the thermal/-deposited layers, the structure after annealing, and single crystal silicon, respectively. Profile (1) (100 Å thermal SiO$_2$/Si) indicates a peak position of 69.1000° which corresponds to a tensile stress of $2.71 \times 10^9$ dynes cm$^{-2}$ using the following relation $$\sigma_{Si} \approx \frac{E}{1 - \gamma} \times \frac{\Delta d}{1 - \gamma} \left( \frac{\sin\Theta_o}{\sin\Theta} - 1 \right)$$

where E/(1-γ)=2.26.10$^{12}$ dynes×cm$^{-2}$ for Si and 2Θ$_0$=69.1970°.

Similarly, the peak position for a 10 nm grown/10 nm TEOS SiO$_2$ deposited stacked SiO$_2$ structure before densification was 69.3200° which corresponds to a compressive stress of $3.6 \times 10^9$ dynes cm$^{-2}$. After densification, the structure was 10 nm grown/10 nm deposited/5 nm grown and had virtually zero stress (2Θ=69.2000°) as shown by curve 43. An equivalent control structure with a 25 nm thermal SiO$_2$ layer in comparison, generated a tensile stress value of about $0.9 \times 10^9$ dynes cm$^{-2}$ in silicon near the interface. A similar trend in the reduction of $\sigma_{si}$ near the Si/SiO$_2$ interface to almost zero value was attained for 15 nm and 10 nm stacked SiO$_2$ layers. The measurements are tabulated in Table 1 and clearly indicate a dramatic reduction in $\sigma_{si}$ and hence the interfacial stress by the sequence of growing, depositing, and growing SiO$_2$ layers. The last step of SiO$_2$ growth during the densification anneal, which constitutes the Si/SiO$_2$ interface, occurs in near-equilibrium conditions under the best possible stress-accommodating circumstances provided by the virtual interface between the grown and deposited SiO$_2$ layer.

iii) Lattice Imaging of the Si/SiO$_2$ Interface

Transmission electron microscopy was used to look at the interfacial roughness and asperities. The specimens were prepared from Si/SiO$_2$ cross sections cleaved parallel to the [110] direction by argon ion-milling to a thickness of 150–200 nm, for stacked oxides and their thermal oxide analog of equivalent thickness. The interfacial roughness for Si/stacked SiO$_2$ layer was less than 1 nm and, in comparison, a roughness of about 3 nm for a Si/thermal SiO$_2$ interface was observed. The relatively large contrast modulation of the silicon layer observed near the interface for thermal SiO$_2$ is due to the stress gradient and localized strain fields. The presence of an interface between the deposited and the grown SiO$_2$ layer, before the densification anneal, was clearly visible and is a signature for the stacked SiO$_2$ dielectric films under bright field imaging conditions.

iv) Dielectric Breakdown and Defect Density

Figure 5:
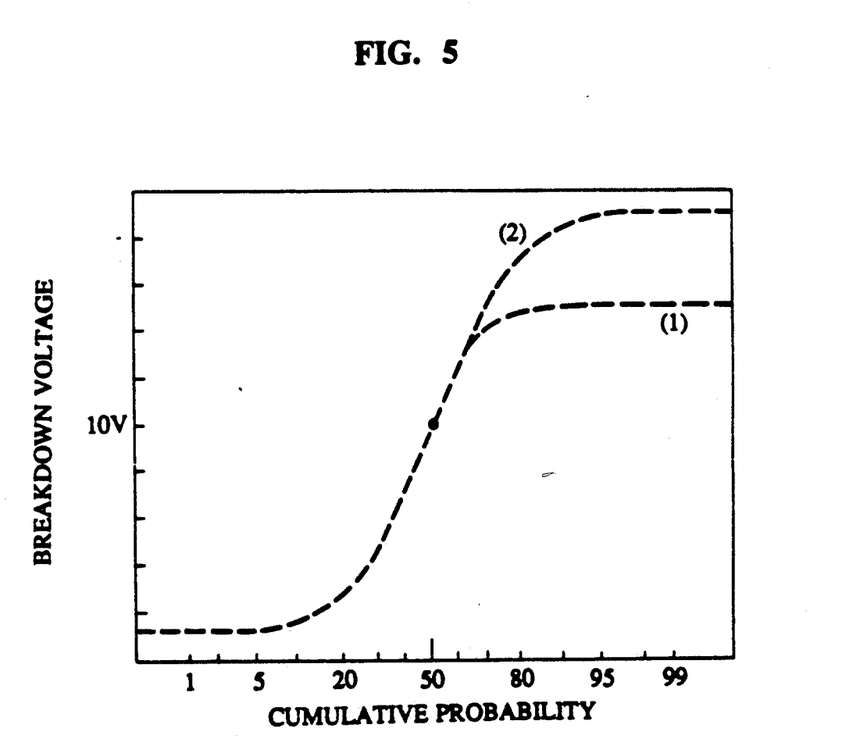
FIG. 5 plots the cumulative probability horizontally versus the breakdown voltage vertically for oxides according to this invention.

Breakdown (bd) tests were performed on a structure such as that described with respect to in FIG. 1. The technique involved applying a negative ramp rate or an equivalent staircase voltage across a test MOS capacitor (620 mm$^2$). The negative polarity with respect to the p-substrate forces the capacitor into accumulation thus minimizing both surface depletion and voltage loss in the silicon region. The technique is described by T. N. Nguyen and D. L. Quinlan in Materials Issues in Silicon IC Processing, MRS Symposia Proceedings, V-71, pp 505–512, 1986. The leakage current across the capacitors was measured as a function of applied voltage until a leakage current of 1 μA was reached. With the present technique, we recorded both self-healing and destructive bd (Fowler-Nordheim tunneling into the oxide) events. To assure a high level of confidence, tests were carried out on approximately 2000 capacitors for each run. These extensive measurements were essential for determining small changes in defect density, D$_o$. The measured data were plotted as distribution plots as a percentage of the sites passing a 1 μA leakage current and destructive bd criteria under a field >4 MV cm$^{-1}$ and are shown schematically in FIG. 5. The cumulative probability is plotted horizontally and the breakdown voltage vertically. Curves (1) and (2) represent 1 μA leakage and destructive breakdown, respectively. The defect-density, D$_o$, was obtained from the derived yield data for 1 μA leakage criteria using the equation Y=exp (−A×D$_o$) where A=0.062 cm$^2$ was used.

Figure 6:
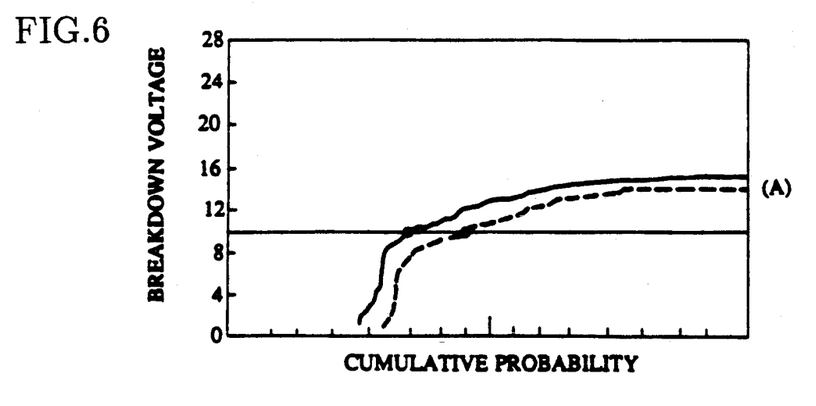
FIGS. 6-8 plots the cumulative probability horizontally for destructive breakdown for 10, 15, and 25 nm stalked SiO$_2$ films, respectively.
Figure 7:
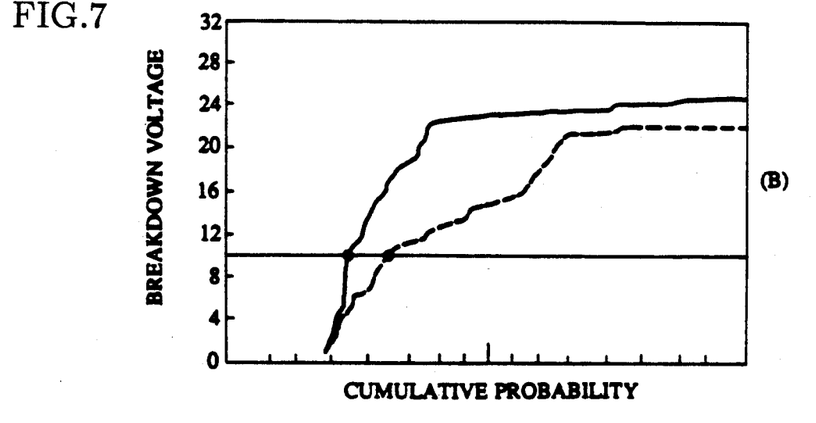
Figure 8:
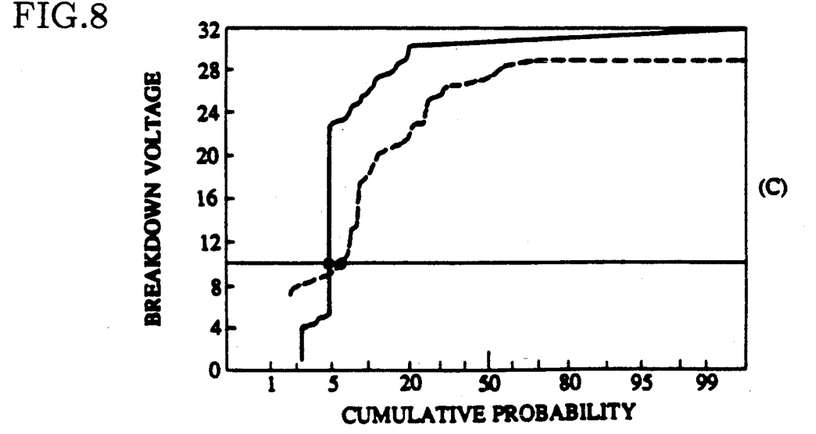

FIGS. 6–8 show typical distribution plots for destructive bd criteria in 10, 15 and 25 nm stacked and thermal SiO$_2$ films, respectively. The cumulative probability is plotted horizontally, and the voltage vertically. The stacked and thermal oxide structures are shown by the solid and dashed lines, respectively. The dramatic improvement in D$_o$ and Y for synthesized stacked SiO$_2$ layers are representative of all thinner 10 and 15 nm dielectric films. A comprehensive summary of D$_o$ and F$_{bd}$ results is given in Table 2.

A comparative Pareto bar diagram of D$_o$ on various thin gate dielectrics based on the reported results for the past 15 years shows that the low defect density in our stacked SiO$_2$ films is comparable to, or better than, what was previously believed to be possible only for dual dielectric Si$_3$N$_4$/SiO$_2$ structures. The present structure offers an important advantage in that it does not suffer from the high density of traps associated with Si$_3$N$_4$/SiO$_2$ interfaces.

(iv) Capacitance-Voltage (C-V) Characteristics

High frequency C-V measurements were obtained by sweeping the voltage from −2 to +10 V and then back to −5 V. Any hysteresis represents the presence of surface states. The C-V stability of the oxides was measured by bias-temperature-stressing (BTS) of the oxide at 250° C. under 2 MV cm$^{-1}$ for 10 minutes and monitoring the flat band voltage shift ($\Delta V_{FB}$), and change in trapped charge state ($Q_f$ and $Q_{it}$). The flat-band shift to a more negative value indicates a buildup of positive charge at the Si/SiO$_2$ interface which is usually due to mobile ion contamination in oxides and/or hole injection from the substrate. Similarly a more positive $\Delta V_{FB}$ is probably due to the hot electron injection from the substrate.

Bias temperature stress studies of C-V characteristics for MOS capacitors fabricated from 100 Å stacked and thermal SiO$_2$ films and a 100 Å SiO$_2$/100 Å Si$_3$N$_4$ dual dielectric showed that the stacked oxide films had virtually no instabilities and the thermal SiO$_2$ control films had only a slight flat band (fb) voltage shift ($-0.03$ V). In comparison, MOS capacitors made from a dual dielectric showed a rather large $\Delta V_{fb}$ of $-0.07$ V which was likely caused by a large buildup of positive charge (mobile ions) at the interface. An asymmetry in the C-V curves near the depletion region was probably due to large density of interface traps. The low frequency (quasistatic) C-V curves were obtained by applying a constant ramp voltage (ramp rate 30 to 300 mV sec$^{-1}$) across the MOS capacitor and measuring the displacement current by an electrometer at 250° C. The displacement current was directly integrated to yield the capacitance. Table 3 shows a summary of MOS C-V results for thin stacked and thermal oxide films of various thickness.

Devices were fabricated in 1.25 μm and 0.9 μm technologies which employ 250 Å and 150 Å gate oxides, respectively. Transistors fabricated employing the stacked gate oxide indicated normal output and transfer characteristics in both n- and p- channel enhancement modes. Device yields and circuit performances attained using these stacked gate oxides in both 1.25 μm and 0.9 μm technologies were better than those attained with the control oxides.

We claim:

1. A semiconductor device for applications requiring a relatively thin oxide layer, said semiconductor device comprising:

a semiconductor substrate;

a first oxide layer grown on an exposed surface portion of said substrate, said first oxide layer including defect structures;

a dielectric layer deposited over said first oxide layer, said dielectric layer being of a composition which is transparent to an oxidizing species, said dielectric layer including defect structures, wherein the dual layer combination of said oxide layer and dielectric layer includes an interface defined therebetween, the dual layer combination having a thickness of at most 150 Å; and a second oxide layer grown underneath said first oxide layer by diffusing an oxidizing species through said dielectric and first oxide layers, said second oxide layer being a relatively thin layer, with respect to the dual layer thickness, which creates an essentially planar, stress-free interface with said substrate.

2. A semiconductor device as defined in claim 1 wherein the dielectric layer is disposed such that the defect structures of said dielectric layer are misaligned with the defect structures of the first grown oxide layer.

3. A semiconductor device as defined in claim 1 wherein the dielectric layer comprises low pressure chemical vapor deposition decomposed tetraethoxysilane.

4. A semiconductor device as defined in claim 1 wherein the dielectric layer comprises a deposited polysilicon layer which is subsequently oxidized to form silicon dioxide.

5. A semiconductor device as defined in claim 1 wherein the first oxide layer comprises a thickness in the range of 25–50 Å, the deposited dielectric layer comprises a thickness in the range of 25–100 Å and the second grown oxide comprises a thickness in the range of 20–50 Å.

6. A semiconductor device as defined in claim 5 wherein the first oxide layer comprises a thickness of approximately 50 Å, the deposited dielectric layer comprises a thickness of approximately 50 Å, and the second grown oxide comprises a thickness of approximately 50 Å.

* * * * *